United States Patent [19]
Suzuki et al.

[11] Patent Number: 4,987,005
[45] Date of Patent: Jan. 22, 1991

[54] CHEMICAL VAPOR PROCESSING METHOD FOR DEPOSITION OR ETCHING ON A PLURALITY OF SUBSTRATES

[75] Inventors: Kunio Suzuki; Takeshi Fukada, both of Tokyo; Mikio Kinka, Kanagawa; Masayoshi Abe, Tokyo; Katsuhiko Shibata, Hamamatsu; Masato Susukida, Atsugi; Noriya Ishida, Hase-Atsugi; Akemi Satake, Hase-Atsugi; Yasuyuki Arai, Kanagawa, all of Japan

[73] Assignee: Semiconductor Energy Laboratory Co., Ltd., Atsugi, Japan

[21] Appl. No.: 396,795

[22] Filed: Aug. 21, 1989

Related U.S. Application Data

[63] Continuation of Ser. No. 166,546, Mar. 10, 1988, abandoned, which is a continuation-in-part of Ser. No. 82,541, Aug. 7, 1987, abandoned.

[30] Foreign Application Priority Data

Aug. 8, 1986 [JP] Japan ................................ 61-186203

[51] Int. Cl.5 ............................................. B05D 5/12
[52] U.S. Cl. ......................................... 427/39; 427/38; 156/643

[56] References Cited

U.S. PATENT DOCUMENTS

| 4,357,195 | 11/1982 | Gorin | 156/345 |
| 4,401,507 | 8/1983 | Engle | 118/723 |
| 4,568,563 | 2/1986 | Jackson et al. | 427/41 |
| 4,585,516 | 4/1986 | Corn et al. | 156/345 |

FOREIGN PATENT DOCUMENTS 63-042115 2/1988 Japan .

Primary Examiner—Norman Morgenstern
Assistant Examiner—Margaret Bueker
Attorney, Agent, or Firm—Sixbey, Friedman, Leedom & Ferguson

[57] ABSTRACT

An improved method for manufacturing uniform films or etching uniformly on a plurality of substrates is shown. The substrates are vertically placed in a reaction chamber so as to be treated at once. A chemical vapor reaction takes place by virtue of a high frequency electric power which is modulated in its amplitude. By this modulation, the deposition or etching can be carried out over the surface of a susbtrate.

11 Claims, 3 Drawing Sheets

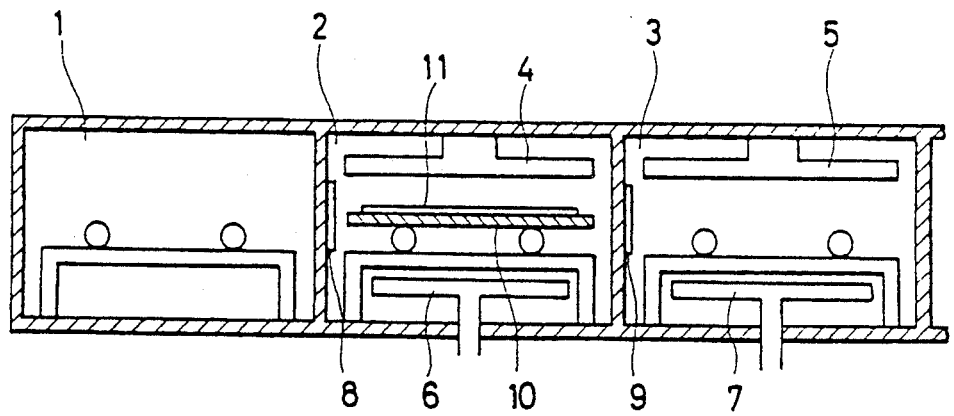
FIG.1 *PRIOR ART*
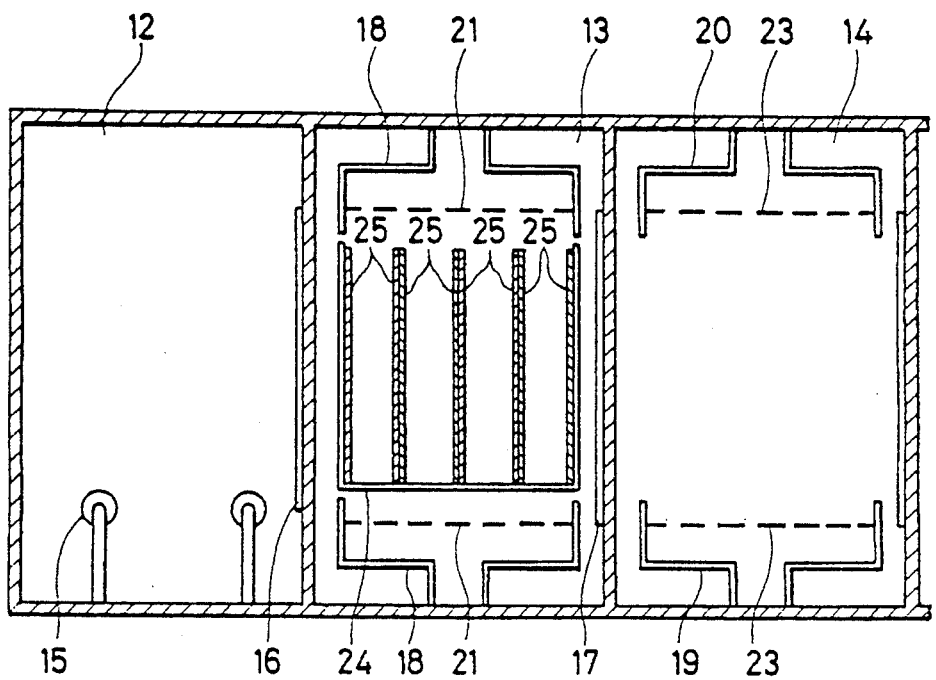
FIG.2

CHEMICAL VAPOR PROCESSING METHOD FOR DEPOSITION OR ETCHING ON A PLURALITY OF SUBSTRATES

RELATED APPLICATION

This application is a continuation of Ser. No. 07/166,546, filed 3/10/88, now abandoned, which itself was a continuation in part of application Ser. No 07/082,541, filed Aug. 7, 1987, now abandoned.

BACKGROUND OF THE INVENTION

The present invention relates to a chemical vapor processing method for depositing or etching a film on a plurality of substrates.

Thin films of non-single crystalline semiconductor have been deposited on a substrate by chemical vapor deposition (hereafter CVD). Such films made of silicon oxide or silicon nitride are suitable for thin film transistors which are used for photoelectric conversion devices such as solar cells, image sensors and the like, or driving devices for liquid crystal devices.

Referring to FIG. 1, a prior art CVD apparatus is schematically illustrated in part. In the figure, the apparatus is formed with a plurality of reaction chambers 2 and 3 and a loading chamber for inputting a substrate into the reaction chamber 2. The substrate 11 is mounted on a substrate holder 10 and transported together with the holder. Each reaction chamber is provided with a heater 6 and a pair of electrodes 4 and 6, the heater 6 functioning also as the electrode. The substrate is heated to a predetermined temperature by the heater 6 and coated with a film by chemical vapor reaction by means of discharge taking place between the electrodes 4 and 6.

As apparent from the figure, the electrode area must be enlarged, if coating on a larger substrate is desired, because the substrates 11 are arranged in parallel with the electrodes. In this process, the coating area of the substrate is limited to the corresponding area of the electrodes.

In order to resolve the conventional shortcomings, another type of deposition system has been proposed in Japanese Patent Application No. sho59-79623 of the Applicant. A plurality of substrates can be treated in this system by arranging the substrates perpendicular to a pair of electrodes inbetween as shown in FIG. 2. Although this proposal is excellent in handling many substrates at once, deposited films thus produced are uneven. In particular, the thickness of the film depends on the distance from the electrodes.

For this reason, uniform etching cannot be accomplished with the prior art device.

SUMMARY OF THE INVENTION

It is, therefore, an object of the present invention to provide a chemical vapor deposition or etching method capable of forming a uniform film on a large surface of a substrate.

It is another object of the present invention to provide a chemical vapor deposition or etching method capable of forming a high quality film on a substrate.

BRIEF DESCRIPTION OF THE DRAWINGS

FIG. 1 is a partial section view showing a prior art CVD apparatus.

FIG. 2 is a partial section view showing a CVD apparatus for the method in accordance with the present invention.

DETAILED DESCRIPTION OF THE PREFERRED EMBODIMENTS

Figure 3:
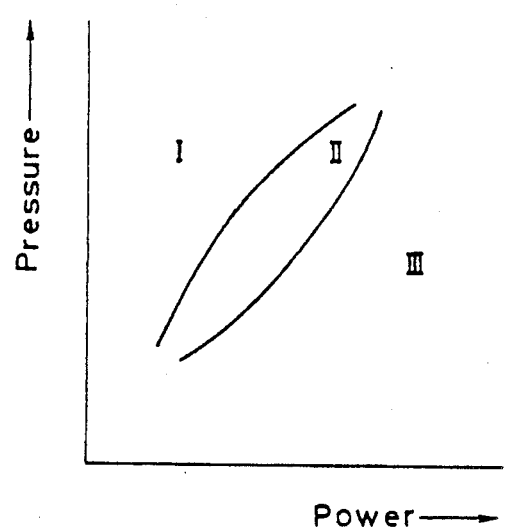
FIG. 3 is a graphical diagram showing deposition condition in the plane of the pressure in a reaction space and the power inputted into the reaction space.
Figure 4A:
FIGS. 4(A) to 4(C) are cross section views showing the thickness of a film deposited by prior art CVD methods.
Figure 4B:
Figure 4C:

To facilitate understanding of the present invention, a prior art method is explained. FIG. 2 shows a CVD apparatus which can be used also for the present invention. The apparatus comprises a loading chamber 12 and a plurality of reaction chambers 13 and 14. On the right side of the reaction chamber 14, further reaction chambers can be continuously installed (not shown in the figure). First, a plurality of substrates 25 are mounted on a substrate holder (tray) 24 and are collectively introduced into the loading chamber 12. The substrates are arranged back-to-back so that the vertical surfaces to be coated are facing each other as shown in FIG. 2. After evacuating the loading chamber 12 and the reaction chamber 13, the substrates on the holder are transported to the reaction chamber 13 with the gate valve opened. In the reaction chamber, a chemical reaction is initiated by the energy supplied from a pair of electrodes 21 whereupon product is deposited on the substrates 25 in the form of films. The section views of films thus deposited are shown in FIG. 4(A) and 4(C). When the pressure in the reaction space is high and the input power is low, the thickness of the film deposited decreases with increasing distance from the electrode 21 as shown in FIG. 4(A). By inverse, when the pressure in the reaction chamber is low and the input power is high, the thickness increases with increasing distance from the electrode 12. The former case takes place in the region I shown in a graphical diagram of pressure-power two dimensional space (FIG. 3). The latter case takes place in the region III in FIG. 3. A very narrow region II exists between the regions I and III, in which a relatively uniform film can be obtained as shown in FIG. 4(B). However, it is difficult to use the region II which tends to fluctuate and be unstable. The film thickness is approximately symmetrical.

Referring again to FIG. 2, the present invention will be described. The deposition method is substantially the same as the prior art explained in the preceding paragraph, except for the input power. The substrates 25 are ten glass substrates of 300 mm × 400 mm which are vertically mounted on the holder 24. The number of substrates can be increased by making the distance between adjacent substrates more short. The discharge can take place between the electrodes, according to experiments, when the distance between facing substrates is larger than 20mm. However, taking into consideration the uniformity of films, it is appropriate to choose the number of substrates at 10–15 in this process, depending on the case. The substrates 25 are heated to 200–300° C. by a heater which is not illustrated but provided on the opposite side wall behind the substrates 25 in the figure. In this condition, silane gas is inputted to the reaction chamber 13 at 50 SCCM and the pressure in the reaction chamber is kept at 0.01 to 0.1 Torr.

Next, a high frequency electric power of 13.56 Hz is applied to the electrodes 21 to produce plasma discharge in between. The discharging space is defined by the holder 24 and upper and lower hoods 18, so that film deposition is limited in the holder 24 and chamber cleaning for each deposition can be dispensed with. The amplitude of the high frequency electric power is modulated with one cycle per 1 to 5 seconds. The degree of modulation is 50% at maximum. The discharge became unstable at the degree of modulation higher than 50%.

Experiments were conducted. Films of non-single crystalline silicon semiconductor were deposited with 5000A in thickness on substrates of 300 mm × 400 mm. The high frequency input power was 100 W at maximum and 60 W at minimum. The deposition time was 20 minutes. The disparity of thickness over the surface of each film was ± 5%.

In particular, the film was formed in accordance with the deposition conditions in the regions I, II and III of FIG. 3 in turn, and, therefore, uniform films eventually were obtained.

In accordance with this process, 400 solar cells (the cell area being 1.05 cm$^2$) were formed on a substrate of 300 mm × 400 mm, each having a pin junction. The efficiencies of these cells were as below:

| EFFICIENCY (%) | NUMBER OF CELLS |
|---|---|
| 11.0 to 10.6 | 12 |
| 10.5 to 10.1 | 206 |
| 10.0 to 9.6 | 173 |
| 9.5 to 9.1 | 9 |
| 9.0 to 8.6 | 0 |

As seen from the above figures, the dispersion of efficiency was very small over cells formed on the substrate. This is attributed mainly to the uniform thickness of an intrinsic semiconductor layer of the pin junction.

Figure 5:
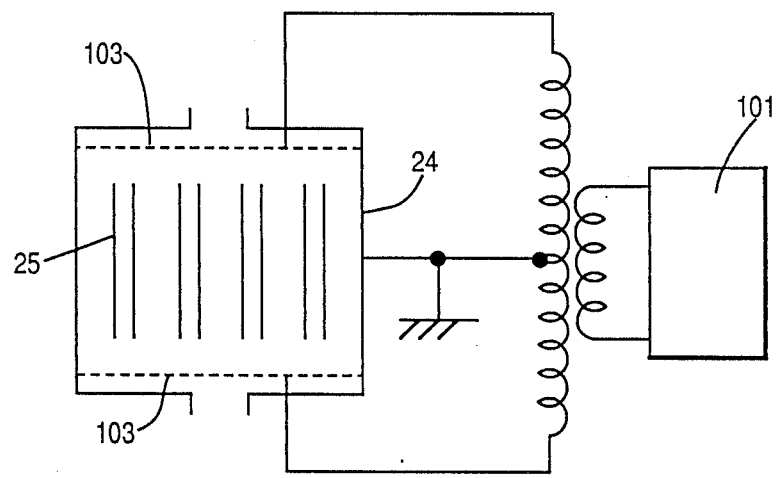
FIG. 5 is a schematic diagram showing another connection between a power source and opposed electrodes.

FIG. 5 is a schematic diagram showing another connection between a power source 101 and an opposed electrode 103. The details of the CVD apparatus are almost the same as illustrated in FIG. 2. As understood from the figure, the opposed electrodes are supplied with an RF power in opposed phases, while a holder 24 for supporting the substrates 25 is grounded. The holder is a hollow cylinder having a rectangular cross section in which a reaction chamber is defined. In this configuration, the strength of the electric field is distributed exactly symmetrical with respect to the substrates 25, so that the deposition has to go on also symmetrical. The RF power is modulated around a certain value. The power range over which the input magnitude is to vary is determined by experiment in each respective case. In particular, the symmetry of the film thus deposited is made certain by this connection; and the disparity of the film is suppressed in the light of modulated amplitude of the input power. When the reaction space is 25 cm high 30 cm long and 30 cm wide for treating 30 cm × 25 cm substrates, and when an amorphous silicon film is to be deposited with silane gas diluted by hydrogen by the method as illustrated in the former embodiment, the power of the input is changed between 5 W and 50 W.

Figure 6:
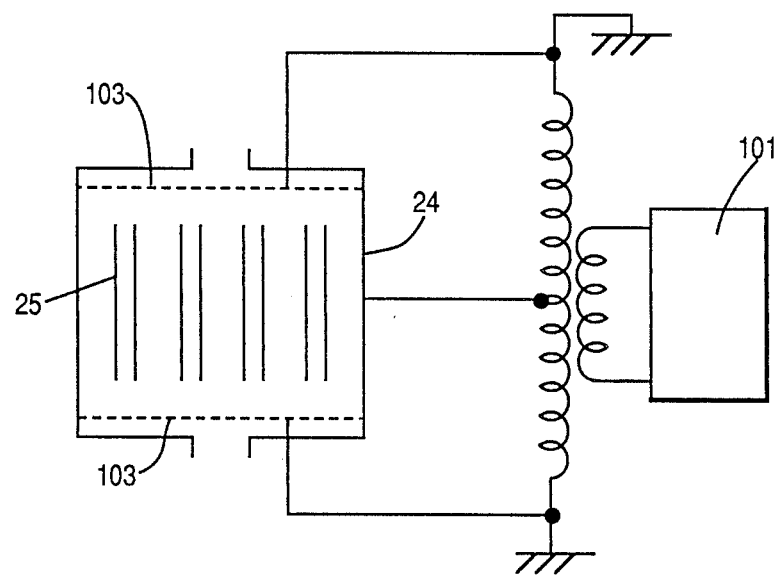
FIG. 6 is a schematic diagram showing yet another connection between a power source and opposed electrodes.

The connection shown in FIG. 5 is suitable for depositing amorphous material because of little sputtering effect. By contrast, the power 101 can be connected with the CVD apparatus as shown in FIG. 6. In this configuration, the electrodes 103 are grounded while the holder is given an r.f. power. This connection is suitable for deposition of very hard carbon film because of high sputtering effect. In what follows, an example of carbon deposition will be described.

After disposing the substrates 25 in the reaction chamber, a reactive gas composed of a gaseous carbon compound such as $CH_4$, $C_2H_4$ and $C_2H_2$, and a dopant gas such as nitrogen, a nitrogen compound gas and a boron compound gas, if necessary, were inputted to the reaction chamber at $1 \times 10^{-3}$ to $5 \times 10^{-1}$ Torr. The carbon compound gas was diluted with hydrogen at 50 mol %. At the same time, the substrates 25 were heated to not higher than 450° C. by means of a heater (not shown). In this condition, a vapor reaction was initiated by means of r.f. power inputted from the power supply. The r.f. power was changed (modulated) between 50 W and 1 KW (0.03 and 3.00 W/cm$^2$) at 13.56 MHz. As a result, carbon films were deposited on the substrates 25 at a growth rate of 150 A/min. The carbon film looked like an amorphous structure rather than a crystalline structure. Despite the amorphous structure, the hardness was measured as high as that of a diamond film. The Vickers hardness thereof was 4500-6400 Kg/mm$^2$, e.g., 2000 Kg/mm$^2$. Therefore, Applicants call it "diamond-like carbon" or DLC for short. When the carbon was deposited without nitrogen and boron compounds, the characteristics remained as good as compared to those obtained with the dopant gas. An experiment using Auger analysis has proved the existence of carbon bonds, in DLC, associated with the orbital sp$^3$ which generally features the diamond structure and has a bond angle of 108° while the bond angle of the sp$^2$ is 120°.

The present invention resides in uniform excitation of process gas by virtue of modulated high frequency electric power so that the invention is useful also for plasma etching of a plurality of substrates. Over one cycle, the amount of excited process gas is made uniform by modulation of input high frequency power and the etching can be carried out uniformly on the substrates.

While some embodiments are described above, the present invention should not be limited to these particular embodiments but only limited by the appended claims. Many modifications and variations may occur to those skilled in the art without departing the spirit and scope of the invention.

What is claimed is:

1. A method of coating an object with a film comprising:

disposing said object in a reaction chamber;
    inputting a reactive gas into said reaction chamber; and
    applying an electric power to said reactive gas in order to initiate a reaction of said reactive gas and form a film by deposition of the product of said reaction,
    wherein the magnitude of said electric power is amplitude modulated between different non-zero levels to provide a substantially uniform thickness of said film on said substrate, the speed of deposition being lower at a center portion than that at a peripheral portion of said substrate at one non-zero power level and the speed of deposition being higher at said center portion than that at said peripheral portion of said substrate at another non-zero power level.

2. The method of claim 1 wherein said electric power is carried by plasma discharge.

3. The method of claim 1 wherein said electric power is a RF power.

4. The method of claim 3 wherein said modulation has one cycle per 1 to 5 seconds.

5. The method of claim 4 wherein the degree of said modulation is less than 50%.

6. The method of claim 2 wherein said reactive gas includes silane gas.

7. The method of claim 3 wherein said reactive gas includes a hydrocarbon.

8. The method of claim 7 wherein the magnitude of said RF power is changed between 50 W and 1 KW.

9. Method of claim 1, wherein the power applying step is performed by a pair of electrodes and said disposing step comprises placing of an object in the form of a planar substrate within the reaction chamber with a surface thereof to be etched being situated perpendicular to and between said pair of electrodes.

10. The method of claim 1, wherein said electric power is carried by plasma discharge.

11. A method of claim 1 wherein said electric power is applied at only one frequency.

* * * * *